(12) United States Patent
Kloper et al.

(10) Patent No.: US 8,086,199 B2
(45) Date of Patent: Dec. 27, 2011

(54) SHARING AGC LOOP BETWEEN DEMODULATOR AND SPECTRUM ANALYSIS SYSTEM

(75) Inventors: David Kloper, Hudson, OH (US); Yohannes Tesfai, Silver Spring, MD (US); Chandra Vaidyanathan, Cleveland, OH (US)

(73) Assignee: Cisco Technology, Inc., San Jose, CA (US)

( * ) Notice: Subject to any disclaimer, the term of this patent is extended or adjusted under 35 U.S.C. 154(b) by 875 days.

(21) Appl. No.: 12/125,563

(22) Filed: May 22, 2008

(65) Prior Publication Data

US 2009/0291657 A1   Nov. 26, 2009

(51) Int. Cl.
*H04B 17/00* (2006.01)
*H04B 1/06* (2006.01)

(52) U.S. Cl. ............... 455/226.1; 455/226.4; 455/232.1; 455/247.1; 455/311

(58) Field of Classification Search ............... 455/226.1, 455/226.4, 231, 232.1, 234.1, 234.2, 240.1, 455/245.1, 247.1, 311, 312
See application file for complete search history.

(56) References Cited

U.S. PATENT DOCUMENTS

| | | | |
|---|---|---|---|
| 6,477,196 B1 * | 11/2002 | Swanke et al. | 375/147 |
| 6,714,605 B2 | 3/2004 | Sugar et al. | |
| 7,184,777 B2 | 2/2007 | Diener et al. | |
| 7,254,191 B2 | 8/2007 | Sugar et al. | |
| 7,292,656 B2 | 11/2007 | Kloper et al. | |
| 7,659,708 B2 * | 2/2010 | Payne, IV | 324/76.23 |
| 7,809,343 B2 * | 10/2010 | Lai et al. | 455/234.1 |
| 7,894,786 B2 * | 2/2011 | Hwang | 455/245.1 |
| 2001/0055328 A1 * | 12/2001 | Dowling | 375/130 |
| 2002/0142745 A1 * | 10/2002 | Kang et al. | 455/232.1 |
| 2002/0160734 A1 * | 10/2002 | Li et al. | 455/245.1 |
| 2003/0099288 A1 * | 5/2003 | Mower et al. | 375/229 |
| 2003/0143967 A1 * | 7/2003 | Ciccarelli et al. | 455/232.1 |
| 2003/0207674 A1 * | 11/2003 | Hughes | 455/234.1 |
| 2004/0097209 A1 * | 5/2004 | Haub et al. | 455/242.1 |
| 2008/0039041 A1 * | 2/2008 | Buchwald et al. | 455/234.1 |
| 2009/0161802 A1 * | 6/2009 | Malla et al. | 375/345 |

* cited by examiner

*Primary Examiner* — Duc M Nguyen
(74) *Attorney, Agent, or Firm* — Edell, Shapiro & Finnan, LLC

(57) ABSTRACT

Systems and methods for sharing an AGC loop between a wireless data demodulator and a spectrum analysis module that operates simultaneously with the data demodulator. In one embodiment, a predetermined hold time prevents the AGC loop from changing gain too often, thereby allowing the spectrum analysis module to collect reliable data. In another embodiment, the hold time may be extended to coincide with a spectrum analysis event, such as a boundary of an FFT block. In still another embodiment, an FFT valid signal is provided such that collected FFT blocks can be designated as suspect and then subsequently processed accordingly.

25 Claims, 13 Drawing Sheets

SHARING AGC LOOP BETWEEN DEMODULATOR AND SPECTRUM ANALYSIS SYSTEM

FIELD OF THE INVENTION

Embodiments of the present invention relate to systems and methods for automatic gain control (AGC) in a device that simultaneously demodulates wireless signals and performs spectrum analysis of a band over which the wireless signals are detectable.

BACKGROUND OF THE INVENTION

The explosive growth in wireless applications and devices over the past few years has produced tremendous public interest benefits. Wireless networks and devices have been deployed in millions of offices, homes, and more recently, in increasing numbers of public areas. These wireless deployments are forecast to continue at an exciting pace and offer the promise of increased convenience and productivity.

This growth, which is taking place mostly in the unlicensed bands, is not without its downsides. In the United States, the unlicensed bands established by the FCC consist of large portions of spectrum at 2.4 GHz and at 5 GHz, which are free to use. The FCC currently sets requirements for the unlicensed bands such as limits on transmit power spectral density and limits on antenna gain. It is well recognized that as unlicensed band devices become more popular and their density in a given area increases, the spectrum will become overcrowded and user satisfaction will collapse. This phenomenon has already been observed in environments that have a high density of wireless devices.

The types of signaling protocols used by devices in the unlicensed bands are not designed to cooperate with signals of other types also operating in the bands. For example, a frequency hopping signal (e.g., a signal emitted from a device that uses the Bluetooth™ communication protocol or a signal emitted from certain cordless phones) may hop into the frequency channel of an IEEE 802.11 wireless local area network (WLAN), causing interference with operation of the WLAN. Thus, technology is needed to exploit all of the benefits of the unlicensed band without degrading the level of service that users expect.

DETAILED DESCRIPTION

Overview

Embodiments of the present invention provide systems and methods for sharing a radio and an AGC loop between a wireless data demodulator and a spectrum analysis module that operates simultaneously with the data demodulator. In one embodiment, a predetermined hold time prevents the AGC loop from changing gain too often, thereby allowing the spectrum analysis module to collect reliable data. In another embodiment, the hold time may be extended to coincide with a spectrum analysis event, such as a boundary of an FFT block. In still another embodiment, an FFT valid signal is provided such that collected FFT blocks can be designated as suspect and then subsequently processed accordingly. Also provided is the ability assign appropriate gain settling times to different components of the system. For example, a spectrum analysis classification process might require a gain settling time that is shorter than, for example, a spectrum analysis plotting function.

Description of Example Embodiments

Figure 1:
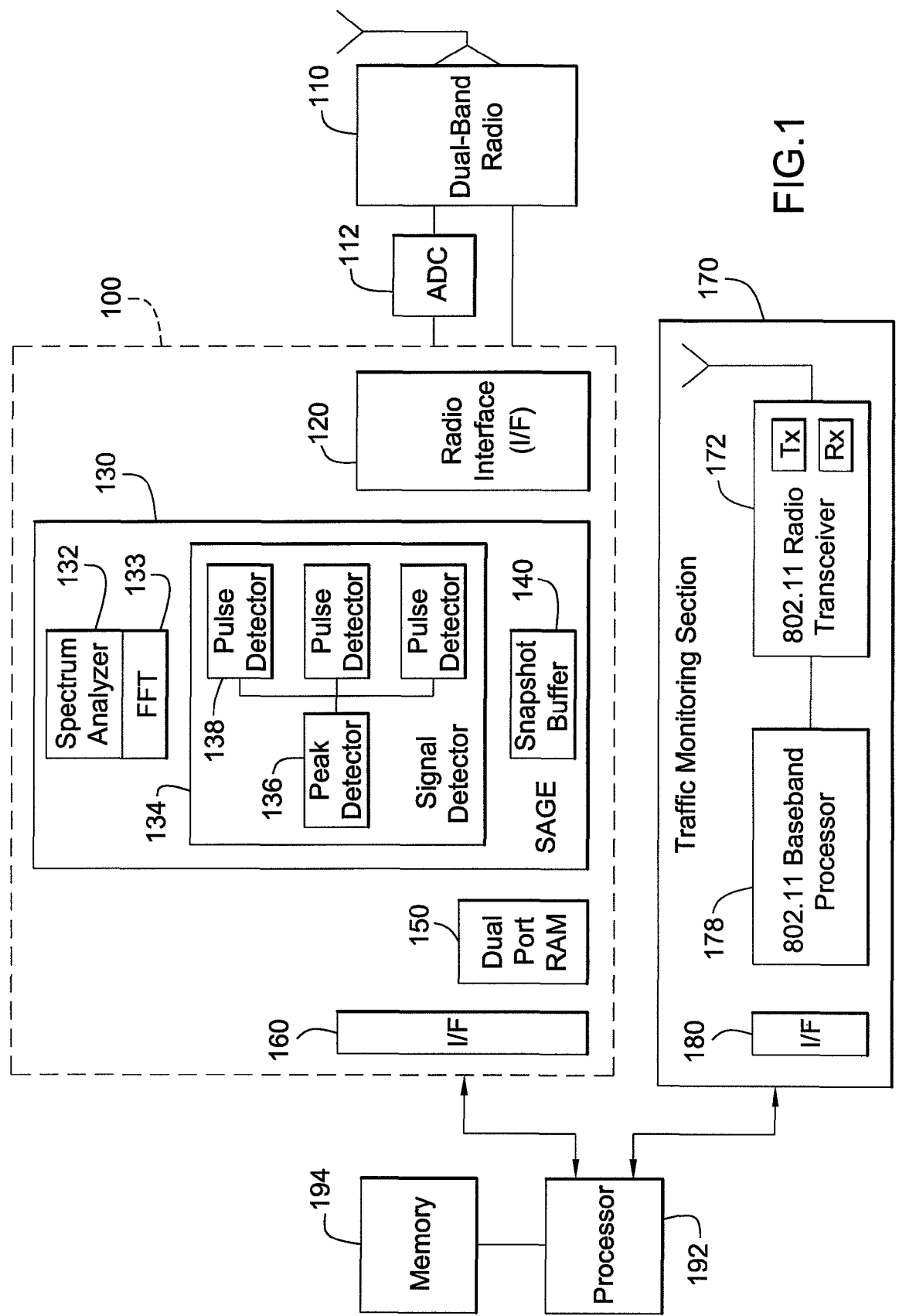
FIG. 1 is a block diagram of a system having a traffic monitoring section and spectrum monitoring section each having its own dedicated radio.

FIG. 1 shows a system including a spectrum analysis engine ("SAgE" or "SAGE") that can be used to monitor a wireless channel in effort to make better use thereof. As shown, there is a spectrum monitoring section 100 to monitor RF activity in the frequency band and a traffic monitoring section 170 that is capable of sending and receiving traffic according to a communication protocol, such as an IEEE 802.11 WLAN protocol. The spectrum monitoring section 100 comprises a radio 110 (primarily for receive operations) that is capable of tuning to receive energy at each channel (or simultaneously all channels in a wideband mode) of, for example, any of the unlicensed bands (2.4 GHz and 5 GHz) in which IEEE 802.11 WLANs operate. An analog-to-digital converter (ADC) 112 is coupled to the radio 110 and converts the downconverted signals from the radio 110 to digital signals. A radio interface (I/F) 120 is coupled directly to the radio 110 and also to the output of the ADC 112. A spectrum analysis engine (SAGE) 130 is coupled to the radio I/F 120. In one embodiment, the SAGE 130 includes a spectrum analyzer 132, a signal detector 134 having a peak detector 136 and one or more pulse detectors 138, and a snapshot buffer 140. A Fast Fourier Transform (FFT) module 133 is coupled between the radio I/F 120 and the spectrum analyzer 132, or, as shown in FIG. 1, included in the spectrum analyzer 132. The SAGE 130 generates spectrum activity information that is used to determine the types of signals occurring in the frequency band, and captures signals for location measurement operations. A dual port random access memory (RAM) 150 is coupled to receive the output of the SAGE 130 and a processor I/F 160 interfaces data output by the SAGE 130 to a processor 192, and couples configuration information from the processor 192 to the SAGE 130. A memory 194 is accessible to the processor 192 for storage of data and program instructions.

The functions of the SAGE 130 will be briefly described in further detail hereinafter. The spectrum analyzer 132 generates data representing a real-time spectrogram of a bandwidth of radio frequency (RF) spectrum, such as, for example, up to 100 MHz. The spectrum analyzer 132 may be used to monitor all activity in a frequency band, for example, the 2.4-2.483 GHz ISM band, or the 5.15-5.35 GHz and 5.725-5.825 GHz UNII bands (embodiments may cover a band form 4.9 to 5.9 GHz). The FFT module 133 is, for example, a 256 frequency bin FFT processor that provides (I and Q) FFT data for each of 256 frequency bins that span the bandwidth of frequency band of interest. A spectrum correction block may be included to correct for I and Q channel imbalance by estimating an I-Q channel imbalance parameter related to phase error and amplitude offset between the I and Q channels, and to suppress a side tone resulting from the RF downconversion process. The spectrum analyzer 132 may further comprise a power computation block to output a power value for each FFT frequency bin. The spectrum analyzer 132 may further include a statistics logic block (not shown) that has logic to accumulate statistics for power, duty cycle, maximum power and a peaks histogram. Statistics are accumulated in the dual-port RAM 150 over successive FFT time intervals or blocks. As an example, an FFT block comprises 256 samples, implying a time interval of 6.4 μs (256/40 MHz). After a certain number of FFT intervals, determined by a configurable value stored in control registers (not shown), an interrupt is generated to output the stats from the dual-port RAM 150. For example, the statistics are maintained in the dual-port RAM 150 for 10,000 FFT intervals before the processor reads out the values. The power versus frequency data generated by the spectrum analyzer 132 may also be used as input to the signal detector.

The signal detector 134 detects signal pulses in the frequency band and outputs pulse event information entries, which include one or more of the start time, duration, power, center frequency and bandwidth of each pulse that satisfies configurable pulse characteristic criteria associated with a corresponding pulse detector.

In the signal detector 134, the peak detector 136 looks for spectral peaks in the (power versus frequency data derived from FFT block output), and reports the bandwidth, center frequency and power for each detected peak. The output of the peak detector 136 is one or more peaks and related information. The pulse detectors 138 detect and characterize signal pulses based on input from the peak detector 136.

The snapshot buffer 140 collects a set of raw digital signal samples useful for signal classification and other purposes, such as location measurements. The snapshot buffer 140 can be triggered to begin sample collection from either the signal detector 134 or from an external trigger source, such as a signal from the processor to capture received signal data for a period of time sufficient to include a series of signal exchanges used for location processing explained hereinafter. Alternatively, the snapshot buffer 140 can be in a free-running state continuously storing captured data, and then in response to detecting the first signal (e.g., a Probe Request frame), the snapshot buffer is put into a post-store mode that extends long enough to capture an ACK frame signal data.

The traffic monitoring section 170 monitors packet activity in a wireless network, e.g., a WLAN, and sends and receives certain packets that are used for location measurement processes. For example, the system may transmit an 802.11 Probe Request frame, data frame or request-to-send frame that may be addressed to the device to be located. Included in the traffic monitoring section 170 are a radio transceiver 172 (comprising a transmitter Tx and a receiver Rx) and a baseband signal processor 178. The radio transceiver 172 and baseband signal processor 178 may be part of a package chipset available on the market today, such as an 802.11 WLAN chipset for any one or more of the 802.11a/b/g/n or other WLAN communication standards. The baseband signal processor 178 is capable of performing the baseband modulation, demodulation and other PHY layer functions compliant with the one or more communication standards of interest (e.g., IEEE 802.11a,b,g,h, etc.). An I/F 180 couples the baseband signal processor 178 and radio transceiver 172 to the processor 192. Additional detail regarding the system of FIG. 1 may be found in U.S. Pat. No. 7,184,777.

While the system of FIG. 1 provides significant capabilities, the system employs two separate radios, thereby consuming more power than may be desired. Moreover, separate radios typically require separate chipsets and antennas, resulting in excess use of "real estate" on circuit boards and increased bill of materials and thus cost as well.

Figure 2:
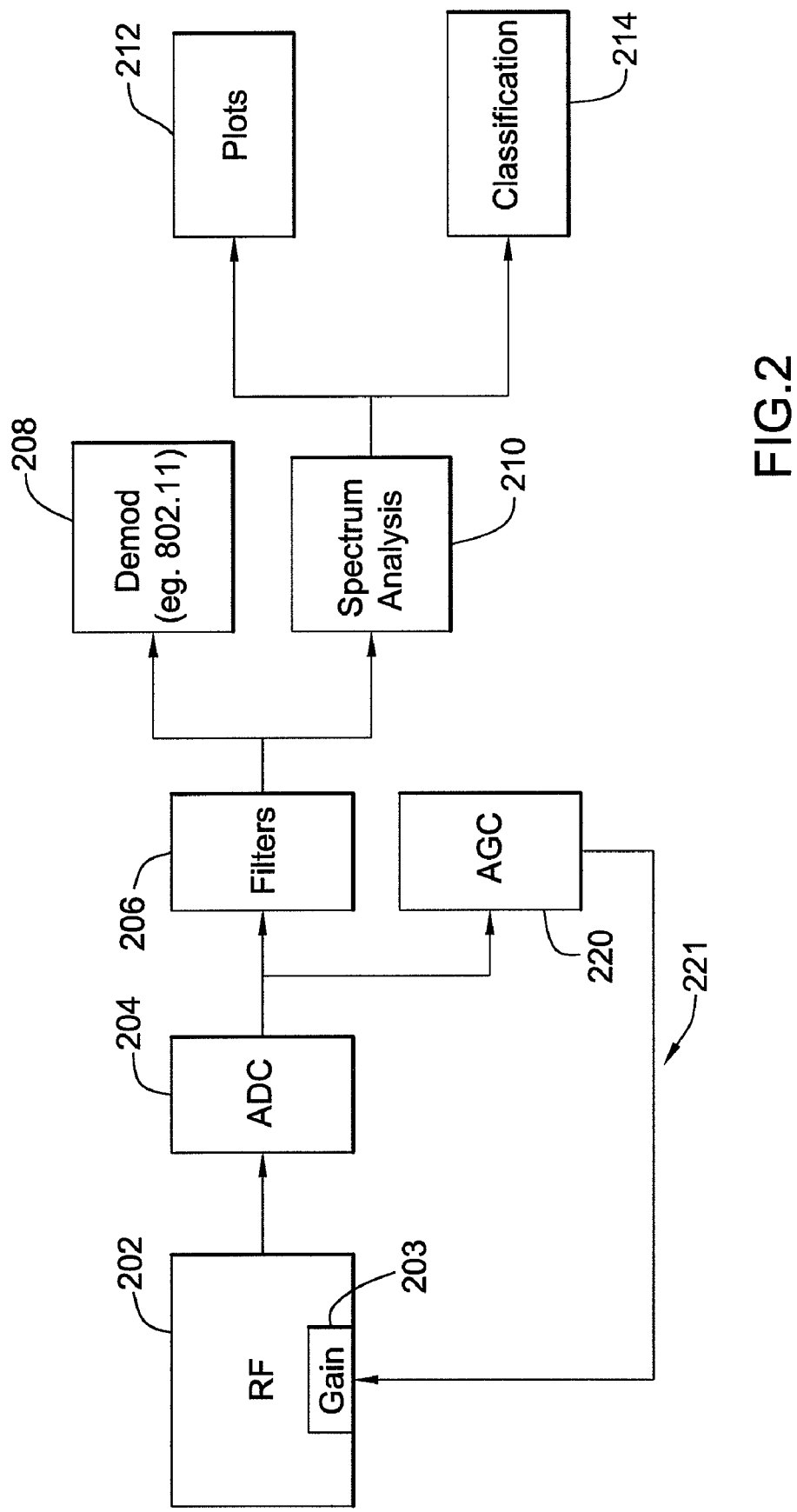
FIG. 2 is a block diagram of a spectrum analysis engine and wireless demodulator using a shared radio in accordance with an embodiment of the present invention.

FIG. 2 is a block diagram depicting an embodiment of the present invention in which a single radio is shared between a wireless demodulator block and a spectrum analysis module. More specifically, a single radio frequency (RF) receiver 202 receives over-the-air transmissions and feeds the received signals to an analog-to-digital converter (ADC) 204 for digitization. The resulting digitized signals are filtered with filters 206 and then passed, on the one hand, to a demodulator 208, such an 801.11x demodulator and, on the other hand, to spectrum analysis module 210 for simultaneous processing. Demodulator 208 is used as a traffic monitoring section, like that shown in FIG. 1. Those skilled in the art will appreciate that demodulator 208 may be configured or designed to monitor other types of traffic including Bluetooth™ communications, among others. Although described herein primarily as a monitoring tool, embodiments of the instant invention may also be implemented as part of a WiFi access point and used to make better use of the radio spectrum at a given location.

Spectrum analysis module 210 may be configured similarly to spectrum monitoring section 100 of FIG. 1. A plots module 212 and a classification module 214 are in communication with spectrum analysis module 210 and are provided, respectively, to provide a visual representation of the spectrum analysis on a display for a user to view, and to provide an indication (e.g., viewable) of the types of signals that are present in a given band that is being monitored by the spectrum analysis module 210. Analyzed data may also be used to provide an "air quality" measure for a given wireless channel.

Also shown in FIG. 2 is an automatic gain control (AGC) block 220 and loop 221. As is well-known in the art, AGC is an adaptive function that monitors an output signal and provides feedback to gain function 203 to adjust the gain to an appropriate level for a range of input signal levels. In other words, AGC may be used to ensure that, e.g., the ADC 204 is not saturated or under driven. Notably, although demodulator 208 and spectrum analysis module 210 share radio 200 including AGC loop 221, demodulator 208 and spectrum analysis module 210 often have different, and sometimes competing, sets of AGC requirements.

For the demodulator 208, a typical demodulation configuration might include an AGC loop to adjust (amplify or attenuate) the receive signal strength to maximize performance of the receiver design for a specific protocol.

Further, there is always a timing budget for different portions of the frame reception, which will drive how quickly the AGC must settle. This budget allows the design to lose samples at the start of a frame, and assumes that all frames are conformant to the protocol implemented.

For the spectrum analysis module or engine 210, in conjunction with the classification module 214, it is sometimes possible to identify an underlying signal source based on RF signatures. With this in mind, one possible approach to classification is to demodulate a signal or several different signals, with each protocol having different requirements on the AGC loop.

If protocols other than the primary function of the demodulator 208 are present (interference), the operation of the AGC loop may be less important to the modem. In one implementation, the demodulator function is designed and optimized for reception of frames of a selected (e.g., 802.11) protocol, while consideration of other protocols is not a focus of the design. That is, the design is concerned with improving receive sensitivity for unique cases of the selected protocol, such as receiving weak frames of the protocol, or for when the protocol "punches" through some weaker signal.

The spectrum analysis module 210 may have different AGC requirements. For example, in one implementation, much of the spectrum analysis is fast Fourier transform (FFT) driven wherein output is computed on a block of samples ($N_{FFT}$). Typically, the gain must be fixed for the duration of $N_{FFT}$. Furthermore, any changes in signal levels during a given FFT can cause undesired artifacts, such as spectral splatter.

Further still, multiple FFT blocks are often required to be computed for display of, e.g., a "Power vs. Frequency" (PvF) plot. PvF plots are usually presented by averaging the FFTs (average trace) or computing a max of the FFTs (max trace). Gain changes during an FFT caused by the AGC 220 can lead to unreliable output. It will not only impede visual plots, but may also interfere with frequency domain pulse identification. These effects are described in, e.g., co-pending application Ser. No. 11/830,390 and U.S. Pat. No. 7,292,656.

In addition, the noise floor level of a radio will vary with gain settings, and so frequent or large adjustments will impact detection thresholds and the ability to detect and/or demodulate weaker signals that may also be present.

Also, with a wider band modem, such as for 802.11, there can often be more than one frame, from different narrow band interferers present on the channel at a time. In addition, some protocols have more amplitude variation than the primary protocol, and so a faster AGC loop might impair the reception of such protocols.

AGC Hold Time

In general, when signal level drops beyond some threshold, a conventional AGC would normally release to a higher gain setting causing at least some of the undesirable effects on spectrum analysis described above when the AGC loop is shared. In order to address this problem, embodiments of the present invention provide that any release (e.g., to a higher gain) of the AGC 220 be delayed, and if the input signal comes back into range during a predetermined hold time, no adjustment to the AGC 220 gain is made. This hold time may be picked to ensure some number of FFTs worth of data is sampled at the same gain setting, or to increase the probability of specific header detections. Once again, although described herein primarily with respect to IEEE 802.11 standards, the present invention is also applicable to other wireless protocols including IEEE 802.16, which is more commonly known as WiMAX.

Figure 3:
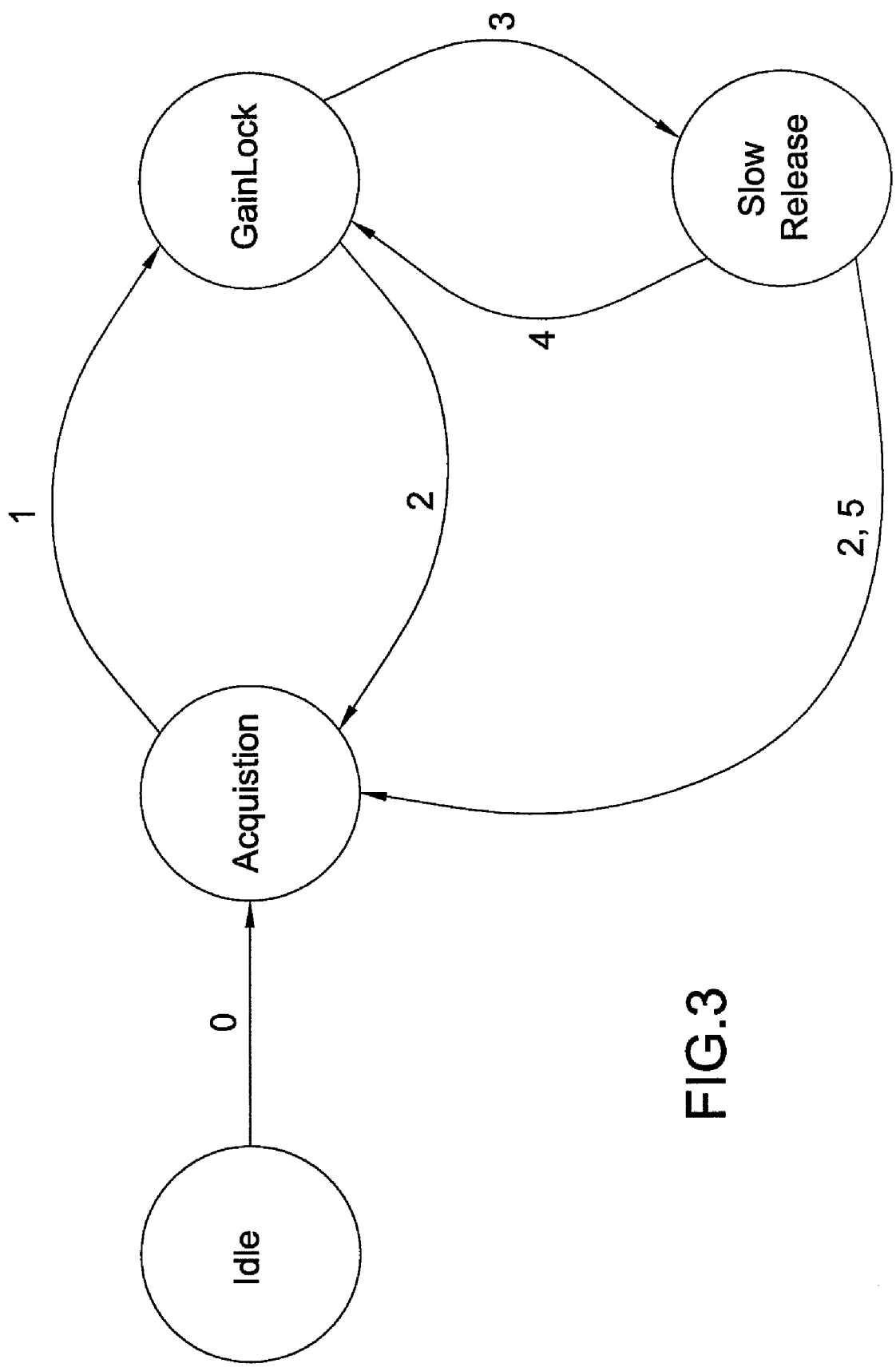
FIG. 3 shows a state diagram for AGC with a hold time function implemented in accordance with an embodiment of the present invention.

FIG. 3 shows a state diagram for an AGC with a hold time function implemented in accordance with an embodiment of the present invention. The state transitions are based on the following definitions:

"agcAttackThresh" is the signal level threshold above which AGC loop must reacquire. Input signal is too strong and the AGC must react to lower the receive gain. A possible value may be −3 dBFS.

"unlockThresh" is the signal level threshold below which the AGC is considered to have lost lock on the signal and the AGC must reacquire. Input signal is weak and the AGC must react to increase the gain. A possible range may be 20 dBFS to −35 dBFS.

"gainChngHoldOver" is the minimum amount of time that gain must be held constant once it has been adjusted to an optimum level with the only exception being if the signal level goes above agcAttackThresh. Generally speaking, this needs to be low for modem applications— e.g. <10 us for 802.11, but for spectrum analysis this needs to be large—e.g., 150 us.

"agcSetPoint" is the ideal signal level at the input to the A/D, typically around 12 dBFS.

Referring again to FIG. 3, the state transitions conditions are as follows:

0—AGC is enabled, and the AGC moves to acquisition mode.

1—AGC is locked (gain optimally set for the input signal). AGC is locked when signal level after the input to the A/D is at the agcSetPoint.

2—Signal>agcAttackThresh (input signal level has increased).

3—Signal<unlockThresh (input signal level has decreased). Here, the process transitions to a "Slow Release" for a "gainChngHoldOver" time before transitioning to "Acquisition" state. A counter (agcCounter) is started at this time.

4—Signal>unlockThresh and Signal<agcAttackThresh (input signal has recovered to near its previous level).

5—Signal<unlockThresh for gainChngHoldOver time (input signal level counter is reset during state transition due to condition 3).

Figure 4:
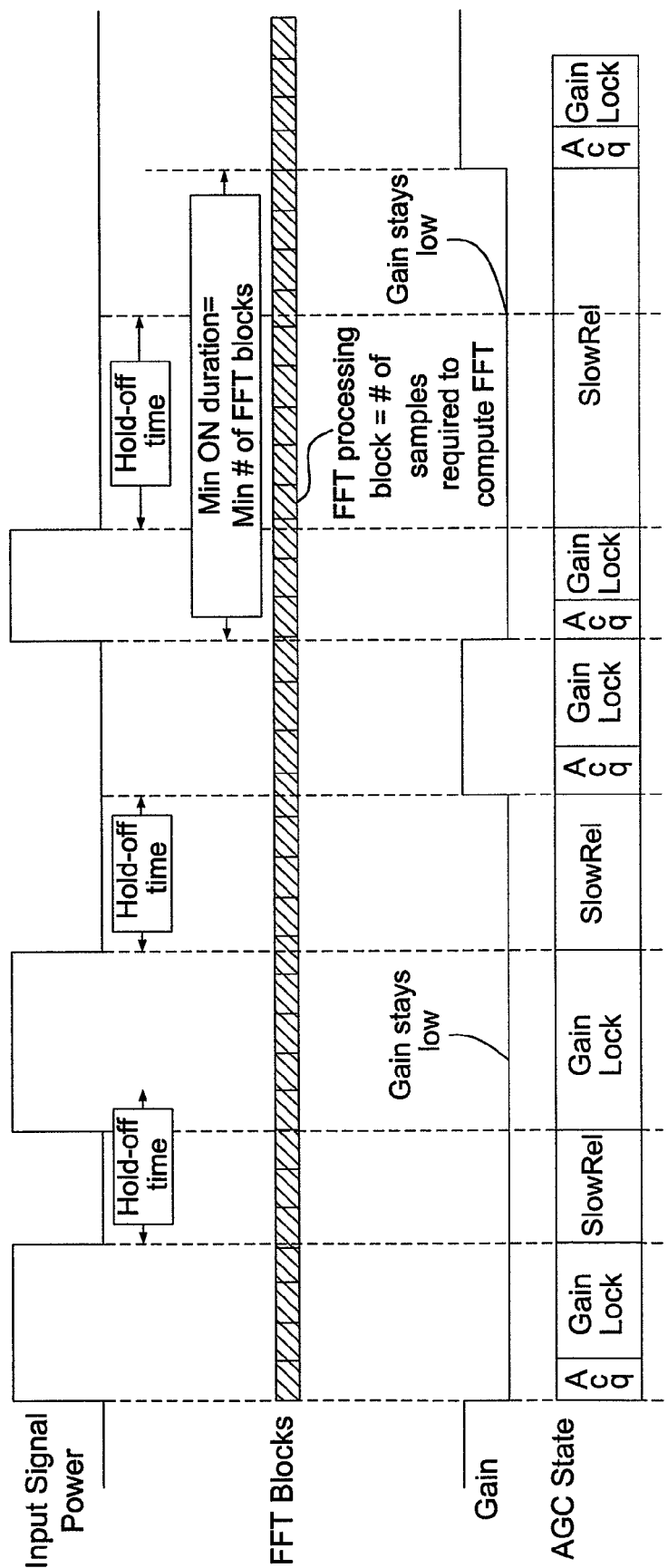
FIG. 4 is a timing diagram that shows an example of a (e.g., wireless) signal that turns on and off, and how AGC reacts at different stages in accordance with an embodiment of the present invention, namely the state diagram of FIG. 3.

FIG. 4 is a timing diagram that shows an example of a (e.g., wireless) signal that turns on and off and how an AGC reacts at different stages in accordance with an embodiment of the present invention. Referring to the lower left of FIG. 4, it can be seen that the state of AGC 220 remains in "Slow Release" for a predetermined period of time that exceeds a low power period for the input signal. The next Slow Release state, however, expires as the input signal power remains low for a period of time longer than the Slow Release period (i.e., the gainChngHoldOver time).

In the last Slow Release state example in FIG. 4, the gain of the AGC 220 is constant for a period of time that is substantially equivalent to a minimum number of FFT blocks that are needed to adequately perform spectrum analysis. As noted above, there is a certain minimum number, $N_{FFT}$, of FFT blocks that may be needed to conduct spectrum analysis, e.g., 1.5 FFTs, which corresponds to 10 μs.

Digital Variable Gain Amplifier to Handle Small Gain Changes

Sometimes an AGC loop will make small gain changes, either increasing or decreasing in gain. This may be in response to certain interferers when the base protocol is not detected, or specific to the normal frame reception design. These changes may occur quite frequently and thus cause disruptions to simultaneous spectrum analysis.

Figure 5:
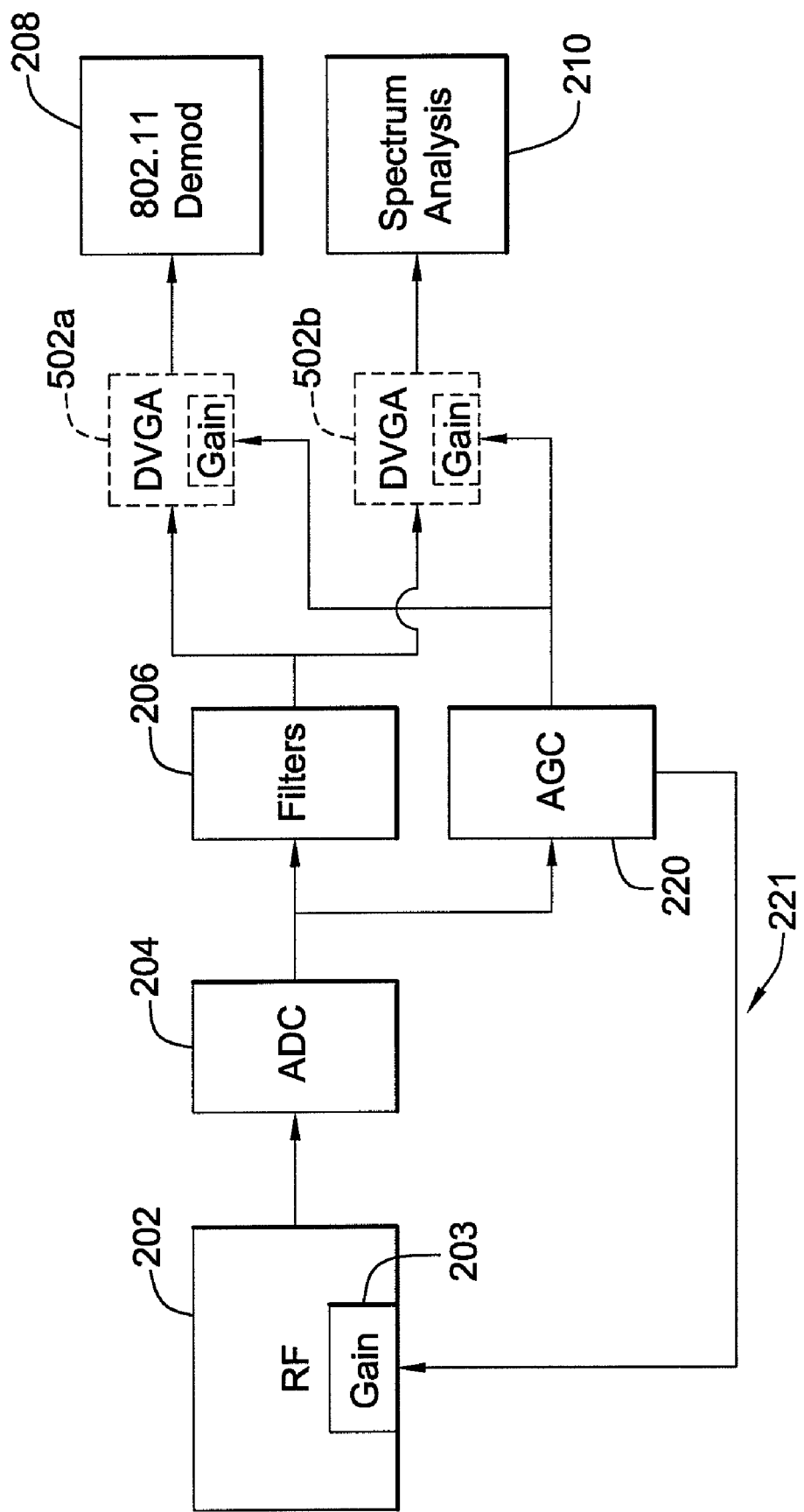
FIG. 5 shows the use of a digital variable gain amplifier (DVGA) in accordance with an embodiment of the present invention.

To address this issue and maintain appropriate signal collection for purposes of spectrum analysis, digital variable gain amplifiers (DVGAs) 502a or 502b may be employed for either the demodulation or the spectrum analysis. Such a configuration is shown in FIG. 5, which is, except for DVGAs 502a, 502b, essentially identical to FIG. 2. These DVGAs are shown in broken lines in FIG. 5 to indicate that, typically, only one DVGA would be present in a given implementation to modify the gain for only one of the demodulator or spectrum analysis module at any given time. Alternatively, a single DVGA could be used where that DVGA is selectably connectable to one of the demodulator 208 or spectrum analysis module 210. With such a configuration, rather than making a small AGC gain change, the gain of the AGC can be held fixed, and the samples to the demodulator 208 can be digitally adjusted (multiplied) by 502a to its "sweet spot," while leaving spectrum analysis samples unchanged. Similarly, if the demodulator 208 must make a small gain change, the samples to spectrum analysis could be adjusted by 502b to minimize the impact. The latter case is less preferable, as some transients may be experienced.

Figure 6:
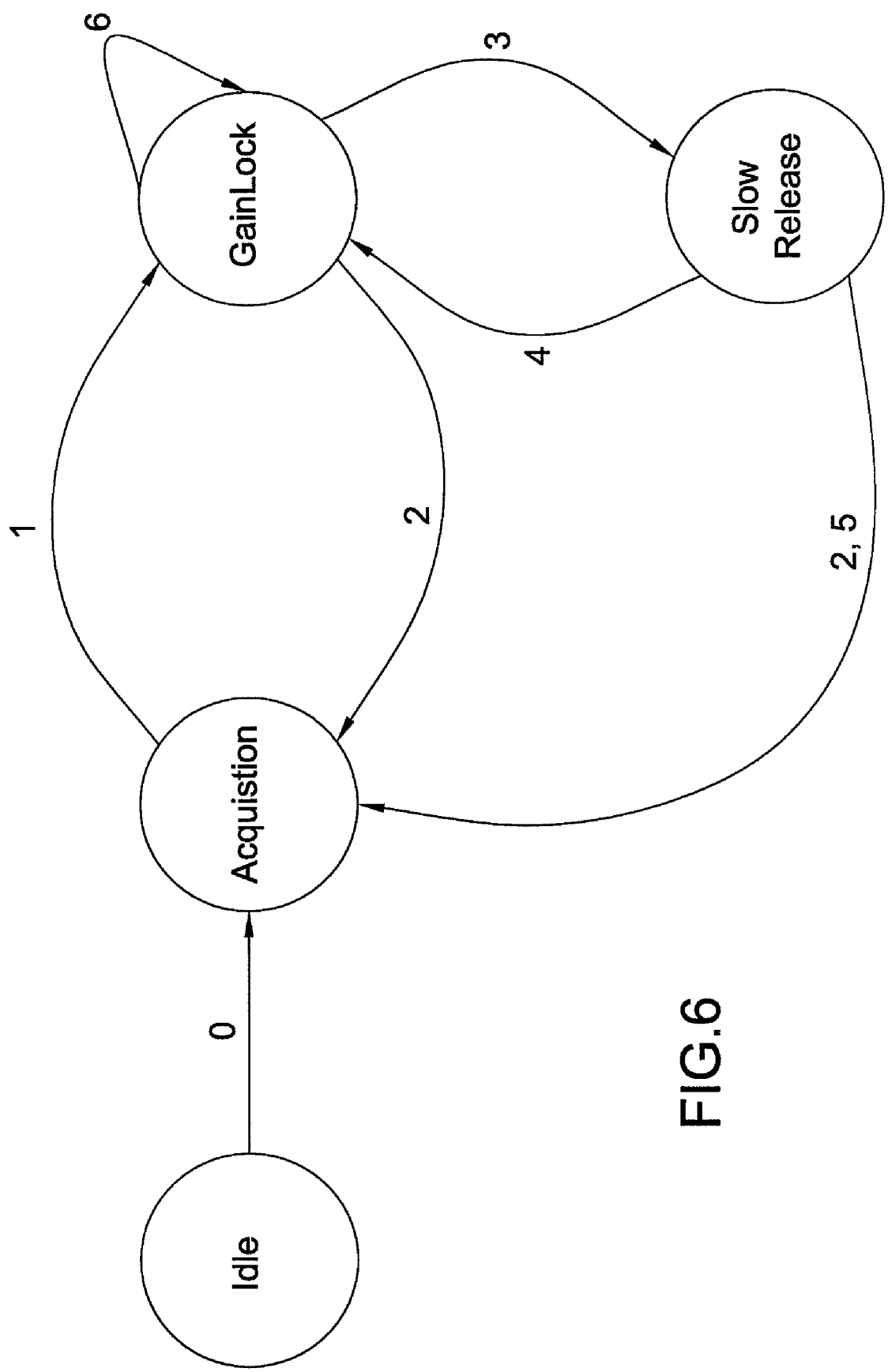
FIG. 6 shows a state diagram that incorporates the use of a DVGA in accordance with an embodiment of the present invention.

The state diagram of FIG. 6 is a slightly modified version of the state diagram of FIG. 3. In the case of FIG. 6, a variable dgvaThresh may be defined as the threshold below which only the DVGA gain is changed and the RF gain (AGC loop 221) is unchanged. A new transition state may be defined as follows for this embodiment:

6—If abs(gainChange)<dvgaThresh, then the AGC state machine stays in "GainLock" state.

Figure 7:
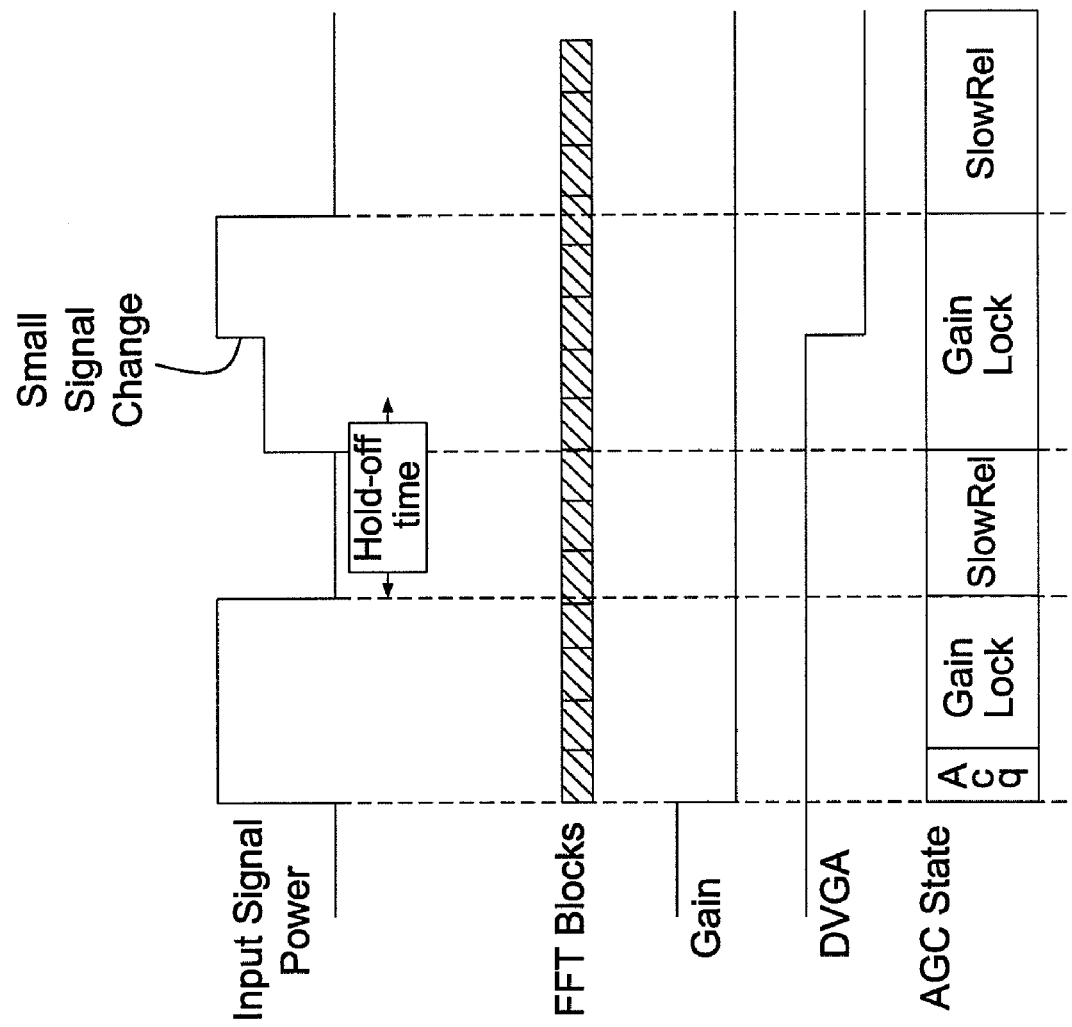
FIG. 7 is a timing diagram showing the respective gain levels of the DVGA and AGC in accordance with an embodiment of the present invention.

The timing diagram of FIG. 7 shows that the AGC gain remains unchanged during a small input signal change, but that the DVGA decreases its gain for a corresponding small increase in the input signal power.

Processing Suspect FFTs

Another issue that arises with respect to sharing a radio between a demodulator and a spectrum analysis system is that when a small gain change is made (digital or analog), FFT transients may occur that impact logic that is analyzing a stream of FFTs. Embodiments of the present invention address this phenomenon as follows. When the gain change during an FFT block is not near the start or end of the FFT block, then that FFT can be "marked" (e.g., stored with a flag, etc.) as suspect. There are several options available for subsequent use of these suspect FFTs. They can be ignored (possibly assuming prior level holds), they can be used with less weighting than "good" or reliable FFTs, or they can be used for detection but not for measurement. An alternate solution would be to abort the FFT in progress, and restart the FFT with only good samples.

Figure 8:
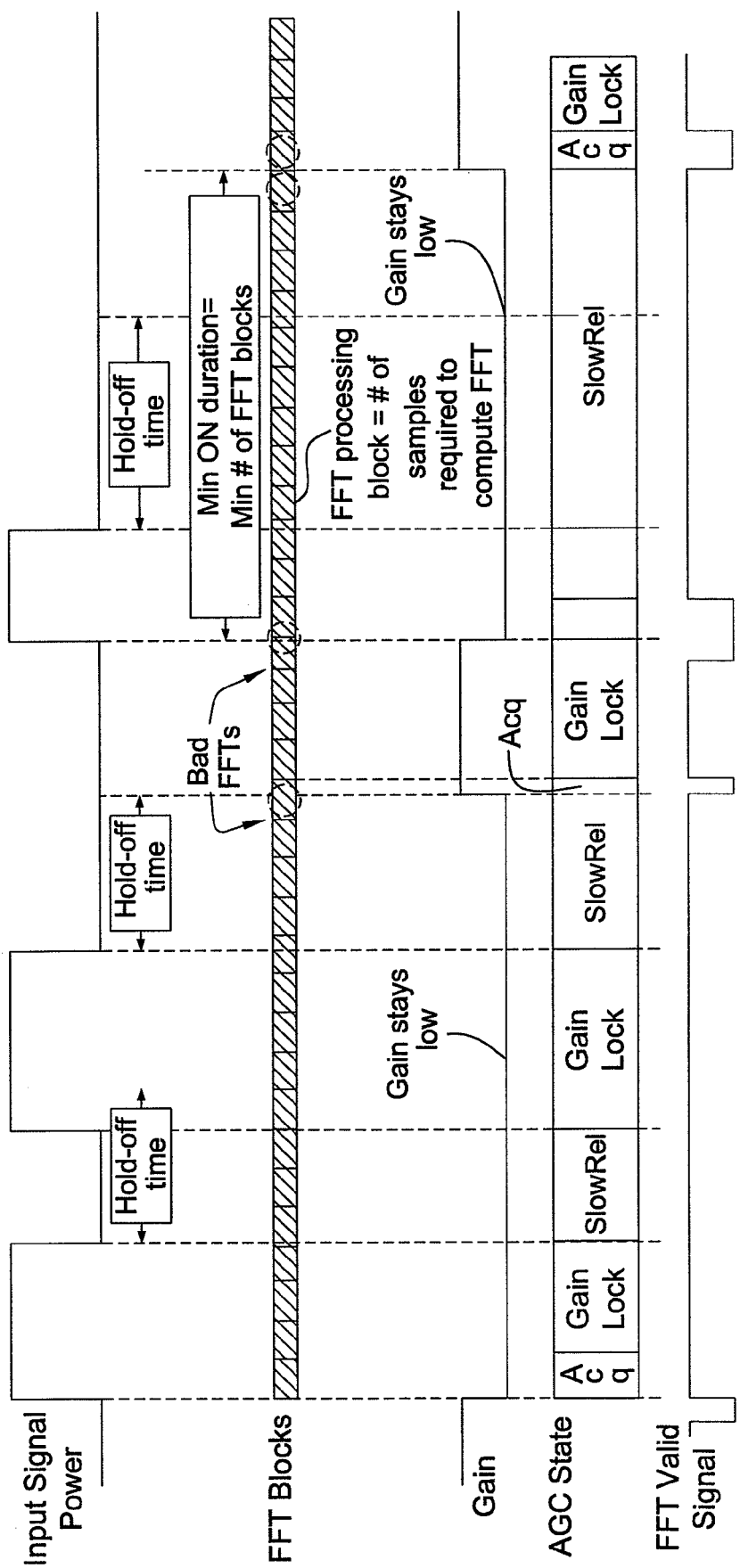
FIG. 8 is a timing diagram showing the use of an FFT valid signal indicative of the reliability of FFT blocks in accordance with an embodiment of the present invention.

FIG. 8 shows a timing diagram consistent with the foregoing. As shown, an "FFT Valid Signal" can be employed to distinguish the valid, "good," or reliable FFTs from any suspect FFTs. The so-called "bad" or suspect FFTs may be so-designated in view of the gain change that occurred during one of the FFT sample blocks.

Gain Change Coincident with Spectrum Analysis Event

Also, a small gain change or an AGC release may interrupt the FFT processing flow. One possible solution to this potential problem in accordance with the present invention is to delay the gain change such that it aligns or coincides with a spectrum analysis event, such as an FFT block boundary. Such an implementation has the effect of minimizing the number of suspect FFTs.

Figure 9:
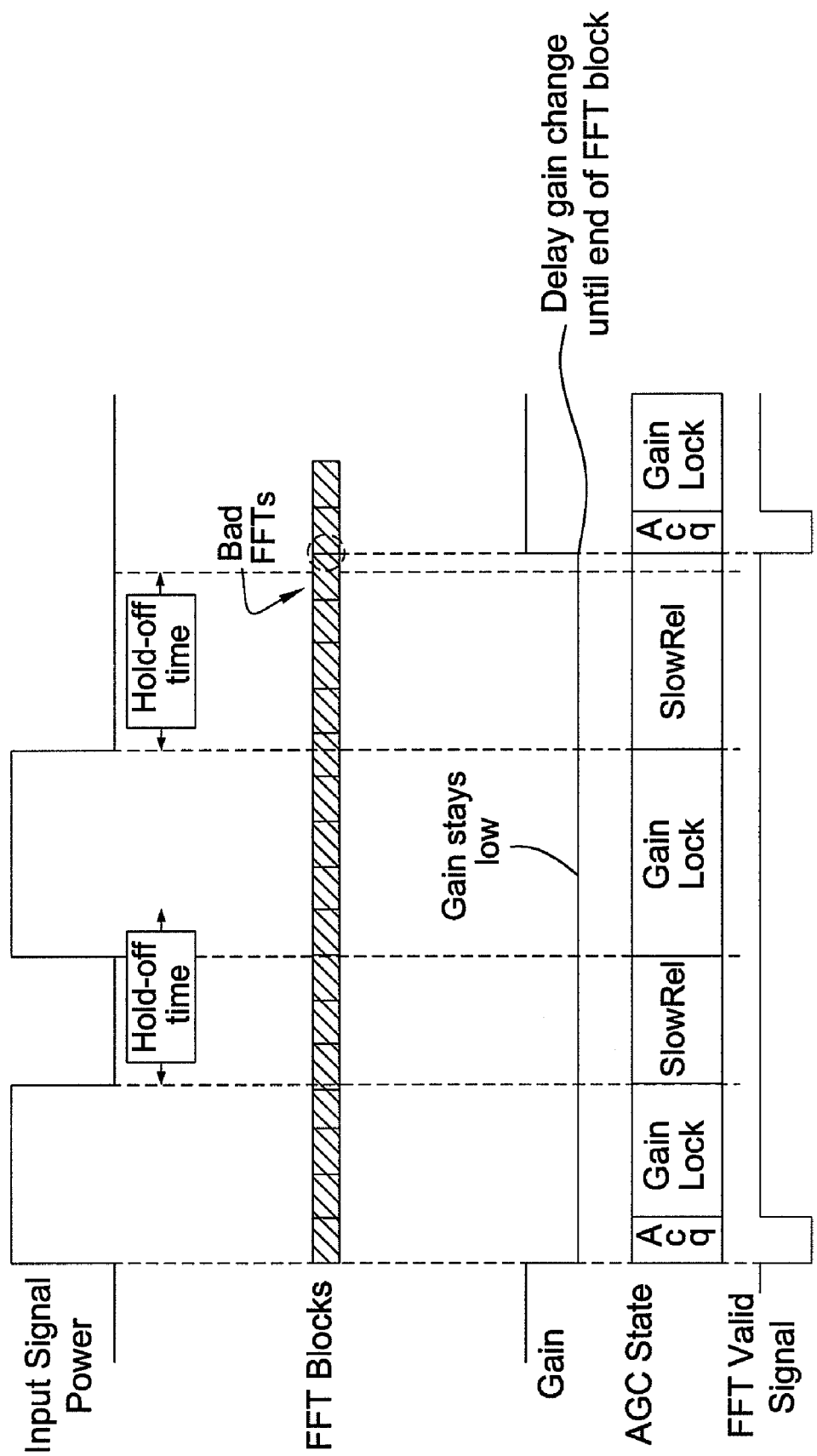
FIG. 9 is a timing diagram that illustrates a gain change delay in accordance with an embodiment of the present invention.

FIG. 9 depicts a timing sequence that illustrates the foregoing. As shown, the Slow Release state is extended slightly beyond its set period to coincide with the boundary of an FFT block. The FFT valid signal transitions to low at the boundary, thereby including one FFT block in the stream that might not have otherwise been included. To implement this extended delay, a feedback signal (Safe_to_Change) from the FFT block (i.e., 133 of FIG. 1) may be provided to indicate when it is safe to make these gain changes. The signal might be asserted for several clocks on either side of an FFT block start (with appropriate pipeline delays) or when an FFT is not being used. Then, the state condition (5), with respect to FIG. 3, is modified as follows:

5—Signal<unlockThresh for at least gainChngHoldOver time and Safe_to_Change is asserted.

Gain Settling Time

A shared radio/AGC loop also introduces a potential problem of selecting an appropriate gain settling time for a particular application. That is, the gain settling time may need to be individually configured for different uses. More specifically, the AGC 220 is preferably configured to wait a predetermined amount of time before sampling to make future gain change decisions. In accordance with an embodiment of the present invention, the demodulator 208, for example, may or may not use the same delay before using samples for a receive operation—as signal acquisition and frequency tracking impose strict requirements on the AGC.

Similarly, the spectrum analysis module 210 may need a different delay before samples can be used for display or detection purposes, such as for longer DC settling times. That is, the DC correction loop may take some time to settle after a gain change. A demodulator would be designed to handle this, but display and FFT data may be impacted by the drift. In other words, the same settling time may not be appropriate for both functions for the following reason. If the settling time is too long, then demodulation may not work. One the other hand, if the settling time is too short then a display of data may include undesirable splatters.

There is also a different delay that may be needed before samples are captured for post processing (e.g., for processing in the classification module 214 shown in FIG. 2). For purposes of example only, typical wait times may be less than 1 us for the demodulator 208 and classification module 214, and about 5 us for plotting using plots module 212.

Figure 10:
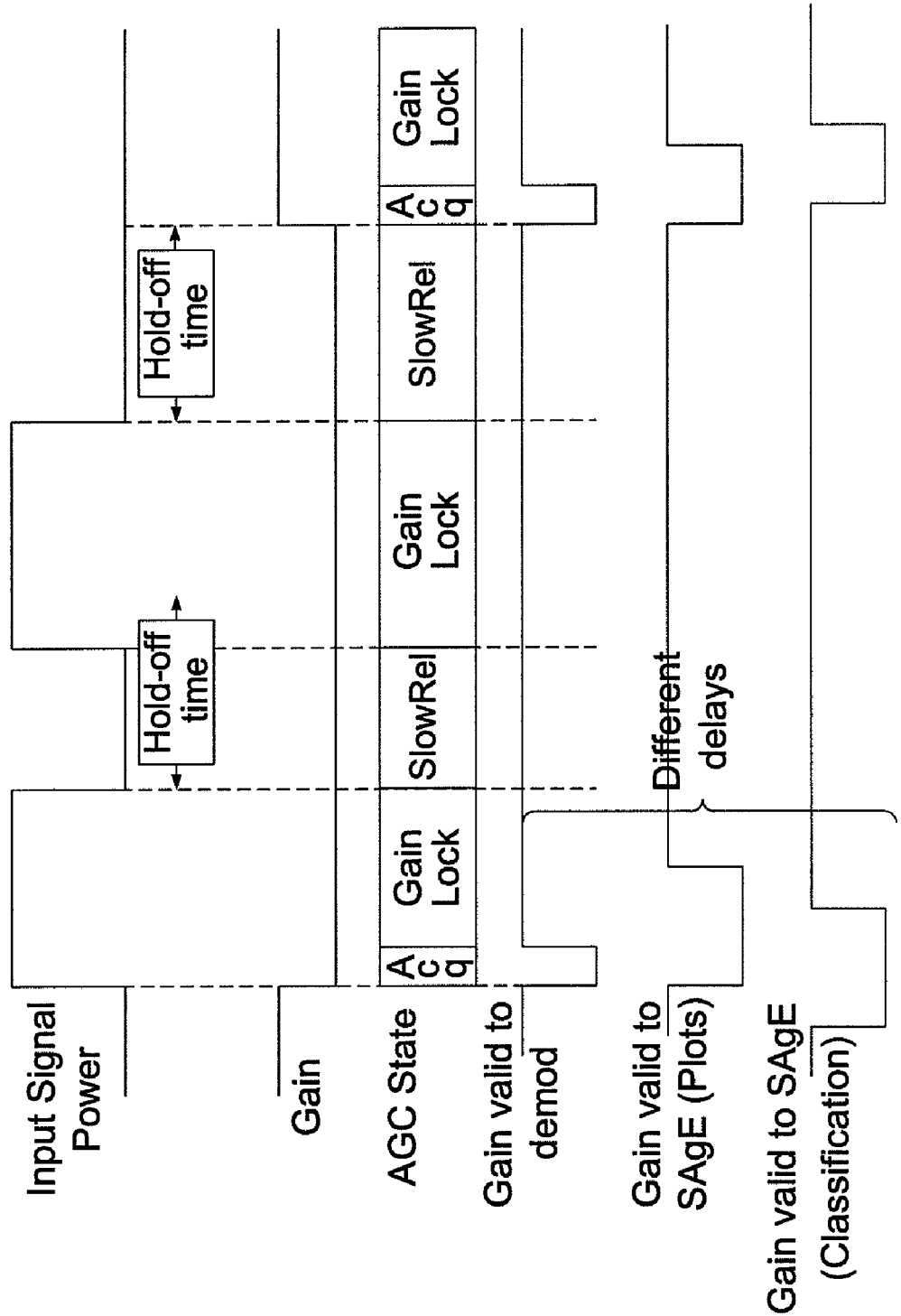
FIG. 10 is a timing diagram that illustrates how different AGC settling times are applied to different processing blocks in accordance with an embodiment of the present invention.

Different delays for the different processing blocks are shown in FIG. 10. Note the delays are preferably software configurable depending on the application/situation (and applies to both edges of gain valid—rising/falling).

Multiple AGC Loops

Figure 11:
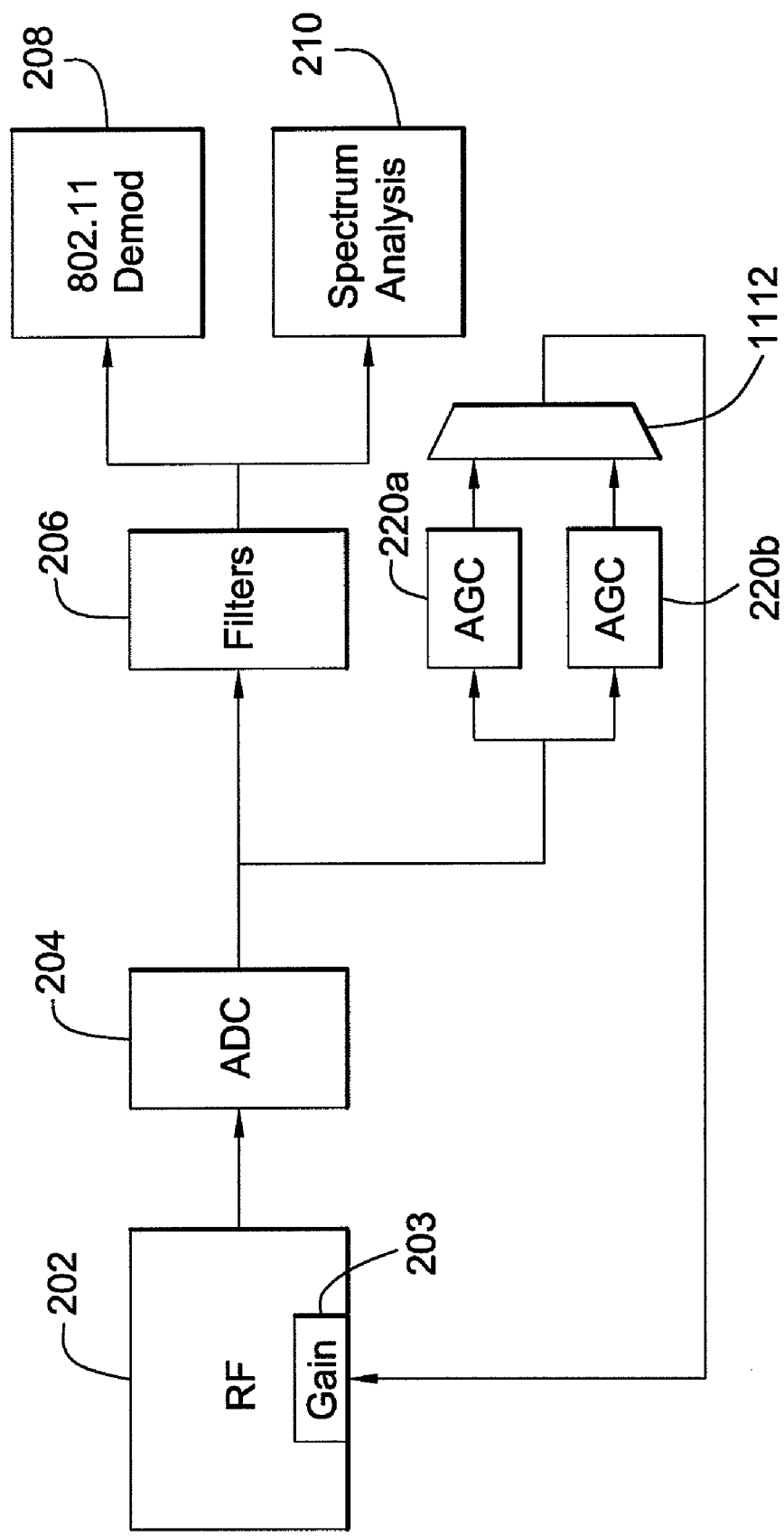
FIG. 11 depicts the use of multiple AGC loops in accordance with an embodiment of the present invention.

Even with the implementation of independent settling times, there may still be a problem in that sometimes the compromises with different delays for gain valid may impair the normal demodulation operation, while still not allowing good results for spectrum analysis in all cases To address this issue, an embodiment of the present invention provides multiple AGC blocks 220a, 220b (or loops) as shown in FIG. 11. By having the ability to switch in desired AGC performance characteristics using multiplexer 1112, it is possible to allow configuration of the "normal" demodulator's AGC loop allowing simultaneous spectrum analysis (so that radio time can be shared for both purposes), as well as other settings (or disabling of features) for best demodulator performance when spectrum analysis is not enabled. It may also be desirable to have a separate AGC loop that is optimized for spectrum analysis only, when demodulation is not required, or for better detection of special interferers such as radar. Although only two AGC blocks 220a, 220b are shown in FIG. 11, those skilled in the art will appreciate that there could be multiple AGC blocks, each separately configurable for a particular purpose. Alternatively, shared loops may be provided, where individual loops are configurable to have selected characteristics.

Figure 12:
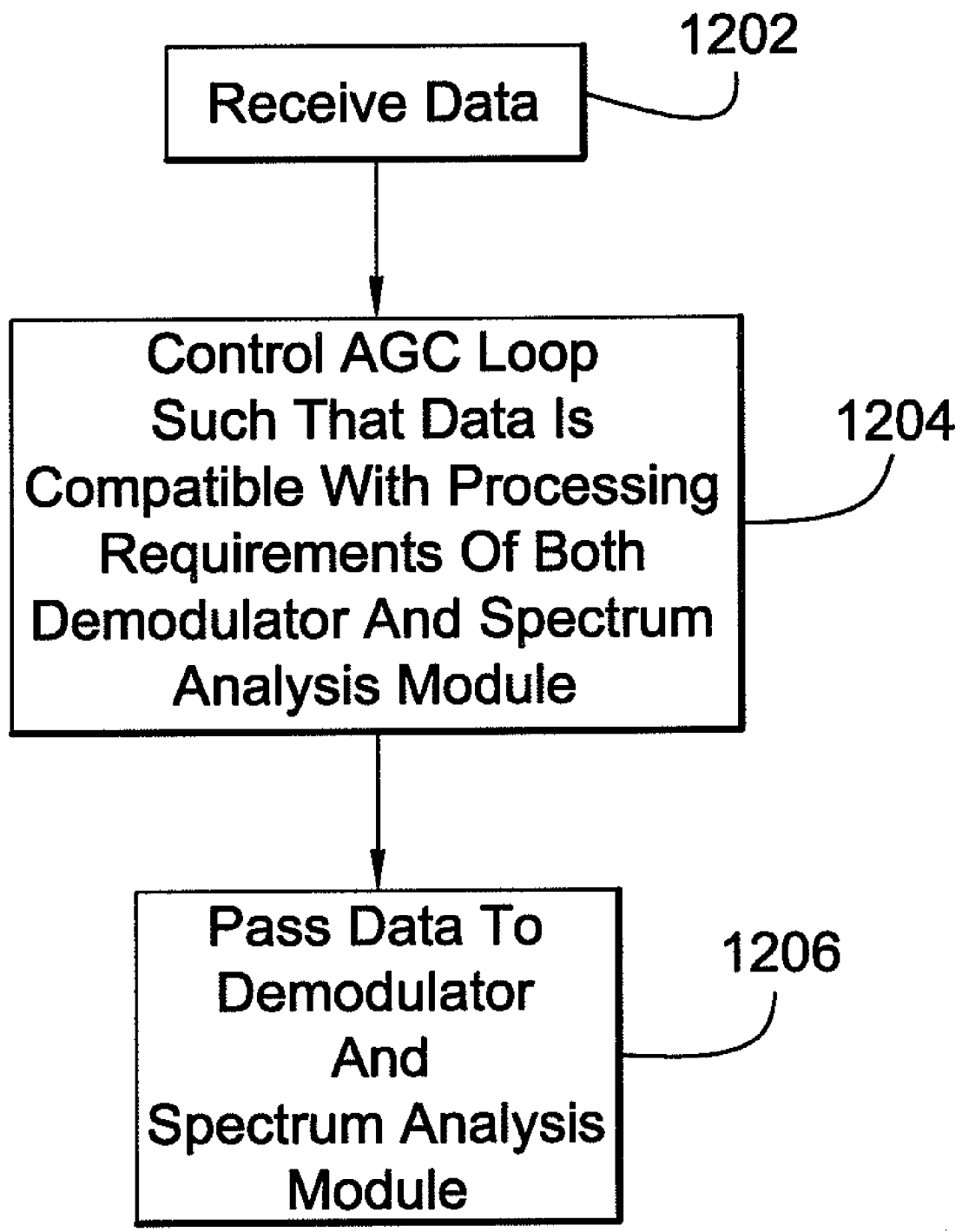
FIG. 12 is a flowchart depicting an example process in accordance with an embodiment of the present invention.

FIG. 12 is a flowchart depicting an example process in accordance with an embodiment of the present invention. As shown, at step 1202, data is received at, e.g., a wireless receiver. At step 1204, an automatic gain control (AGC) loop associated with the receiver is controlled such that the data is compatible with the processing requirements of both the demodulator 208 and the spectrum analysis module 210. The data, as indicated by step 1206, is then passed from the receiver to both the demodulator 208 and the spectrum analysis module 210 for further processing.

Figure 13:
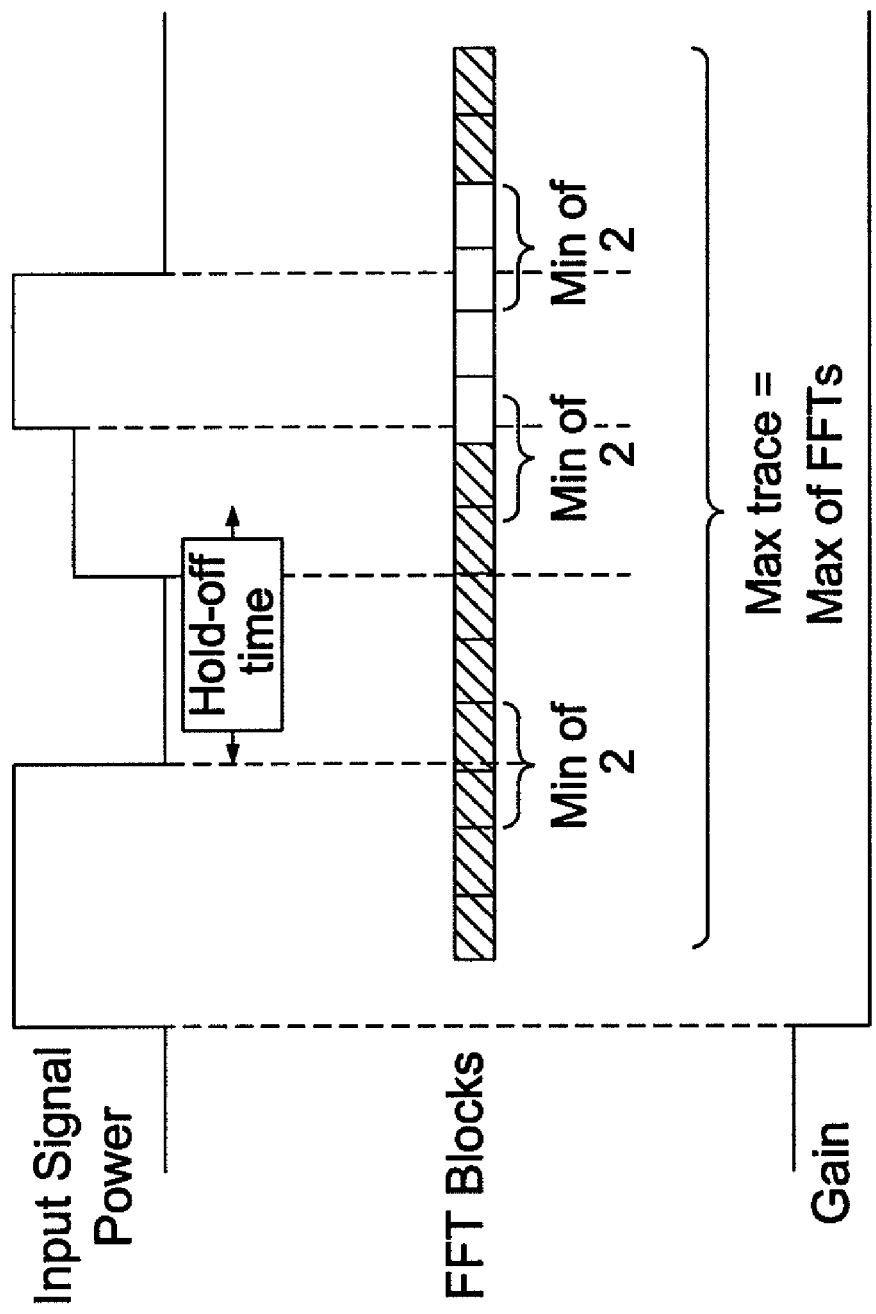
FIG. 13 depicts a timing diagram that shows how a minimum of two FFT blocks must have a same value in order to treat that value as a reliable value in accordance with an embodiment of the present invention.

In another aspect of the invention, it has been observed that an FFT display may show transients during a small AGC gain change, or when an input signal starts/stops during a given FFT. FIG. 13 depicts a "minimum of two FFT" approach for reducing or eliminating the display of such transients. In one real-time mode of operation, a "Max trace" spectrum analysis option tracks a maximum across the dwell of the minimum of the last two FFTs for each frequency bin. As a result, transients that do not persist and random variation in noise are suppressed from the display, without losing the detection of hoppers and burst transmitters. Limiting or eliminating altogether such transients is desirable to reduce display splatter and undesirable effects of the trace.

It will be apparent to those skilled in the art that various modifications and variations can be made in the systems and methods described herein consistent with the principles of the present invention without departing from the scope or spirit of the invention. Although several embodiments have been described above, other variations are possible consistent with the principles of the present invention.

Other embodiments of the invention will be apparent to those skilled in the art from consideration of the specification and practice of the disclosed embodiments. The specification and examples are exemplary only, and the true scope and spirit of the invention is defined by the following claims and their equivalents.

What is claimed is:

1. A system, comprising:
a radio having a radio frequency receiver and an automatic gain control (AGC) loop;
a demodulator configured to demodulate wireless traffic received by the receiver; and
a spectrum analysis module configured to perform spectrum analysis of a frequency band over which the wireless traffic was detected,
wherein the AGC loop is configured to allow the demodulator and the spectrum analysis module to operate simultaneously,
wherein the AGC loop is configured to remain at a selected gain level for a predetermined hold time after a change in input signal power is detected by the AGC loop, and
wherein the spectrum analysis module is configured to designate a fast Fourier transform (FFT) block as suspect when an AGC gain level change does not coincide in time with a boundary of the FFT block.

2. The system of claim 1, wherein the predetermined hold time is equivalent to a period of time sufficient for the spectrum analysis module to process a minimum number of fast Fourier transform (FFT) blocks at the selected gain level.

3. The system of claim 1, wherein the spectrum analysis module ignores FFT blocks that have been designated as suspect.

4. The system of claim 1, wherein the spectrum analysis module assigns less weight to FFT blocks that have been designated as suspect compared to FFT blocks not so designated.

5. The system of claim 1, wherein the spectrum analysis module relies on FFT blocks designated as suspect only for detection but not for measurement.

6. The system of claim 1, wherein an FFT valid signal indicates whether a given FFT block should be designated as suspect.

7. The system of claim 1, wherein the gain level change is further delayed to align with a spectrum analysis event.

8. The system of claim 7, wherein the spectrum analysis event is a boundary of a fast Fourier transform (FFT) block.

9. The system of claim 1, further comprising a plots module and a classification module.

10. The system of claim 9, wherein different gain settling times are applied to at least two of the demodulator, the plots module and the classification module.

11. A system, comprising:
a radio having a radio frequency receiver and a plurality of selectable automatic gain control (AGC) loops, wherein the selectable AGC loops are selectable using a multiplexer coupled between a plurality of AGCs and the radio frequency receiver;
a demodulator configured to demodulate wireless traffic received by the receiver; and
a spectrum analysis module configured to perform spectrum analysis of a frequency band over which the wireless traffic was detected,
wherein a given one of the selectable AGC loops is selectable to favor operability of the demodulator or the spectrum analysis module, and the given one of the selectable AGC loops is employed by both the demodulator and spectrum analysis module.

12. The system of claim 11, wherein the demodulator and the spectrum analysis module operate simultaneously.

13. The system of claim 11, wherein one of the selectable AGC loops delays a change in AGC loop gain to accommodate fast Fourier transform (FFT) block processing.

14. A method, comprising:
receiving data at a wireless receiver;
controlling an automatic gain control (AGC) loop associated with the receiver such that the data is compatible with processing requirements of both a demodulator and a spectrum analysis module;
passing the data from the receiver to both the demodulator and the spectrum analysis module,
wherein the controlling comprises maintaining a given AGC gain level for a predetermined hold time after a change in input signal power is detected by the AGC loop, and
further comprising designating, as suspect, a fast Fourier transform (FFT) block when an AGC gain level change does not coincide in time with a boundary of the FFT block.

15. The method of claim 14, wherein the predetermined hold time is equivalent to a period of time sufficient for the spectrum analysis module to process a minimum number of fast Fourier transform (FFT) blocks at a selected gain level.

16. The method of claim 14, further comprising ignoring FFT blocks that have been designated as suspect.

17. The method of claim 14, further comprising assigning less weight to FFT blocks that have been designated as suspect compared to FFT blocks not so designated.

18. The method of claim 14, further comprising:
relying on FFT blocks designated as suspect only for detection but not for measurement.

19. The method of claim 14, further comprising generating an FFT valid signal that indicates whether a given FFT block should be designated as a suspect FFT block.

20. The method of claim 14, further comprising extending the predetermined hold time to coincide with a spectrum analysis event.

21. The method of claim 20, wherein the spectrum analysis event is a boundary of a fast Fourier transform (FFT) block.

22. The method of claim 14, further comprising controlling a digital variable gain amplifier disposed between the receiver and the demodulator, but not between the receiver and the spectrum analysis module.

23. The method of claim 14, further comprising controlling a digital variable gain amplifier disposed between the receiver and the spectrum analysis module, but not between the receiver and the demodulator.

24. Logic encoded in one or more tangible media for execution and when executed operable to:
simultaneously pass data from a receiver to both a demodulator and a spectrum analysis module; and
control an automatic gain control (AGC) loop associated with the receiver such that the data is compatible with the processing requirements of both the demodulator and the spectrum analysis module by maintaining a given AGC gain level for a predetermined hold time after a change in input signal power is detected by the AGC loop, and
designate, as suspect, a fast Fourier transform (FFT) block when an AGC gain level change does not coincide in time with a boundary of the FFT block.

25. The logic of claim 24, wherein the predetermined hold time is equivalent to a period of time sufficient for the spectrum analysis module to process a minimum number of fast Fourier transform (FFT) blocks at a selected gain level.

* * * * *